(12) United States Patent
Yi et al.

(10) Patent No.: US 8,719,657 B2
(45) Date of Patent: May 6, 2014

(54) HYBRID CODEC APPARATUS AND METHOD FOR DATA TRANSFERRING

(75) Inventors: Chih-Wei Yi, Hsinchu (TW);
Pin-Chuan Liu, Hsinchu (TW);
Hsiao-Heng Lu, Kaohsiung (TW)

(73) Assignees: Industrial Technology Research Institute, Hsinchu (TW); National Chiao Tung University, Hsinchu (TW)

( * ) Notice: Subject to any disclaimer, the term of this patent is extended or adjusted under 35 U.S.C. 154(b) by 494 days.

(21) Appl. No.: 13/110,911

(22) Filed: May 18, 2011

(65) Prior Publication Data

US 2012/0155531 A1 Jun. 21, 2012

(30) Foreign Application Priority Data

Dec. 21, 2010 (TW) .............................. 99145027 A

(51) Int. Cl.
*H03M 13/00* (2006.01)
(52) U.S. Cl.
USPC .......................................................... 714/755
(58) Field of Classification Search
USPC .................. 714/746, 755, 786, 800
See application file for complete search history.

(56) References Cited

U.S. PATENT DOCUMENTS

| 6,073,250 | A | 6/2000 | Luby et al. |
| 6,856,263 | B2 | 2/2005 | Shokrollahi et al. |
| 6,909,383 | B2 | 6/2005 | Shokrollahi et al. |
| 7,030,785 | B2 | 4/2006 | Shokrollahi et al. |
| 7,711,068 | B2 | 5/2010 | Shokrollahi et al. |
| 7,720,174 | B2 | 5/2010 | Shokrollahi et al. |
| 7,971,129 | B2 * | 6/2011 | Watson et al. ................ 714/784 |
| 8,516,344 | B2 * | 8/2013 | Kim .............................. 714/774 |
| 2006/0153315 | A1 | 7/2006 | Chen et al. |
| 2006/0224760 | A1 | 10/2006 | Yu et al. |
| 2007/0195894 | A1 * | 8/2007 | Shokrollahi et al. .......... 375/242 |
| 2012/0210190 | A1 * | 8/2012 | Luby et al. .................... 714/755 |

FOREIGN PATENT DOCUMENTS

| EP | 1055287 B1 | 11/2010 | |
| TW | 484265 | 4/2002 | |
| TW | 530267 B | 5/2003 | |
| TW | I222057 | 10/2004 | |
| WO | WO 2009/075508 | * 6/2009 | ............ H03M 13/41 |

OTHER PUBLICATIONS

Zhang et al., A hybrid codec for very low bit rate video coding, 1996, IEEE, p. 641-644.*

(Continued)

*Primary Examiner* — Shelly A Chase

(57) ABSTRACT

In a hybrid codec apparatus for data broadcasting, an encoder divides a source file into N sections, generates N principal encoded data after coding on a first finite field and k additional encoded data after coding on a second finite field, then transmits a group of coefficient encoded data and the N+k encoded data to a decoder. The decoder merges the group of coefficient encoded data and the N+k encoded data, and decodes the N principal encoded data on the first finite field. When the decoder fails to decode the N principal encoded data, the decoder uses the k additional encoded data to assist the data decoding on the second finite field. After the decoding, a recovered source file is produced.

17 Claims, 12 Drawing Sheets

(56) References Cited

OTHER PUBLICATIONS

LT Codes, Michael Luby, Digital Fountain, Inc., Proceedings of the 43rd Annual IEEE Symposium on Foundations of Computer Science (FOCS'02) IEEE, Authorized licensed use limited to: National Chiao Tung University. Downloaded on Feb. 8, 2009 at 10:10 from IEEE Xplore. Restrictions apply.

Raptor Codes, Amin Shokrollahi, Senior Member, IEEE Transactions on Information Theory, vol. 52, No. 6, Jun. 2006.

A Digital Fountain Approach to Reliable Distribution of Bulk Data, John W. Byers, Michael Lubyt, Michael Mitzenmachert, Ashutosh Rege, 1998.

Svetla Nikova, Vincent Rijmen, Martin Schlaffer, "Using Normal Bases for Compact Hardware Implementations of the AES S-box" Security and Cryptography for Networks Lecture Notes in Computer Science, vol. 5 229, 2008, pp. 236-245.

Taiwan Patent Office, Office Action, Patent Application U.S. Appl. No. TW099145027, Feb. 17, 2014, Taiwan.

* cited by examiner

| $D_0$ | $D_1$ | $D_2$ | $D_3$ | $D_4$ | $D_5$ | $D_6$ | $D_8$ |

$$\begin{bmatrix} E_0 & E_1 & E_2 & E_3 & E_4 & E_5 & E_6 & E_7 & | & E_8 & E_9 \end{bmatrix}$$

$$=$$

$$\begin{bmatrix} D_0 & D_1 & D_2 & D_3 & D_4 & D_5 & D_6 & D_7 \end{bmatrix}$$

$$\times$$

| 1 | 0 | 0 | 0 | 0 | 0 | 0 | 0 | 5 | 91 |
|---|---|---|---|---|---|---|---|---|---|
| 0 | 1 | 0 | 0 | 0 | 0 | 0 | 0 | 48 | 55 |
| 0 | 0 | 1 | 0 | 0 | 0 | 0 | 0 | 124 | 18 |
| 0 | 0 | 0 | 1 | 0 | 0 | 0 | 0 | 19 | 210 |
| 0 | 0 | 0 | 0 | 1 | 0 | 0 | 0 | 250 | 165 |
| 0 | 0 | 0 | 0 | 0 | 1 | 0 | 0 | 116 | 47 |
| 0 | 0 | 0 | 0 | 0 | 0 | 1 | 0 | 94 | 47 |
| 0 | 0 | 0 | 0 | 0 | 0 | 0 | 1 | 37 | 15 |

| E0 | E1 | E2 | E3 | E4 | E5 | E6 | E7 | E8 | E9 |
|---|---|---|---|---|---|---|---|---|---|
| 1 | 1 | 0 | 1 | 0 | 0 | 1 | 1 | 5 | 91 |
| 0 | 1 | 1 | 0 | 0 | 1 | 0 | 1 | 48 | 55 |
| 1 | 0 | 1 | 1 | 0 | 1 | 1 | 0 | 124 | 18 |
| 1 | 1 | 0 | 0 | 1 | 0 | 0 | 0 | 19 | 210 |
| 0 | 1 | 1 | 1 | 0 | 1 | 0 | 0 | 250 | 165 |
| 1 | 1 | 0 | 0 | 1 | 0 | 0 | 1 | 116 | 47 |
| 1 | 0 | 1 | 0 | 1 | 1 | 1 | 0 | 94 | 47 |
| 0 | 1 | 0 | 1 | 0 | 1 | 1 | 0 | 37 | 15 |

| | | | | | | | | |
|---|---|---|---|---|---|---|---|---|
| D₀ | 1 | 0 | 0 | 0 | 0 | 0 | 0 | 0 |
| D₁ | 0 | 1 | 0 | 0 | 0 | 0 | 0 | 0 |
| D₂ | 0 | 0 | 1 | 0 | 0 | 0 | 0 | 0 |
| D₃ | 0 | 0 | 0 | 1 | 0 | 0 | 0 | 0 |
| D₄ | 0 | 0 | 0 | 0 | 1 | 0 | 0 | 0 |
| D₅ | 0 | 0 | 0 | 0 | 0 | 1 | 0 | 0 |
| D₆ | 0 | 0 | 0 | 0 | 0 | 0 | 1 | 0 |
| D₇ | 0 | 0 | 0 | 0 | 0 | 0 | 0 | 1 |
| E₈ | 5 | 48 | 124 | 19 | 250 | 116 | 94 | 37 |
| E₉ | 91 | 55 | 18 | 210 | 165 | 47 | 47 | 15 |

$$\begin{bmatrix} D_0 & D_1 & D_2 & D_3 & D_4 & D_5 & D_6 & D_7 \end{bmatrix} \times \begin{bmatrix} 1 & 0 & 0 & 0 & 0 & 1 & 1 & 1 & 1 & 1 \\ 0 & 1 & 0 & 0 & 0 & 1 & 0 & 1 & 0 & 0 \\ 1 & 1 & 1 & 0 & 0 & 0 & 1 & 0 & 0 & 0 \\ 0 & 1 & 1 & 0 & 0 & 1 & 0 & 0 & 1 & 1 \\ 0 & 0 & 0 & 1 & 0 & 0 & 1 & 0 & 1 & 1 \\ 0 & 0 & 0 & 0 & 1 & 1 & 0 & 1 & 1 & 1 \\ 1 & 0 & 0 & 1 & 0 & 0 & 0 & 1 & 1 & 1 \\ 0 & 1 & 1 & 1 & 1 & 1 & 1 & 1 & 1 & 1 \\ 5 & 48 & 124 & 19 & 250 & 116 & 94 & 37 \\ 91 & 55 & 18 & 210 & 165 & 47 & 47 & 15 \end{bmatrix}$$

$$= \begin{bmatrix} E_0 & E_1 & E_2 & E_3 & E_4 & E_5 & E_6 & E_7 & E_8 & E_9 \end{bmatrix}$$

FIG. 9A $$\begin{bmatrix} 1 & 0 & 0 & 1 & 1 & 1 & 1 & 1 & 1 \\ 0 & 1 & 0 & 1 & 1 & 0 & 1 & 0 & 0 \\ 1 & 1 & 1 & 0 & 0 & 0 & 1 & 0 & 0 \\ 0 & 1 & 1 & 0 & 0 & 0 & 0 & 1 & 1 \\ 0 & 0 & 0 & 1 & 1 & 0 & 0 & 1 & 1 \\ 0 & 0 & 0 & 0 & 0 & 1 & 0 & 1 & 1 \\ 1 & 0 & 1 & 1 & 0 & 1 & 1 & 0 & 1 \\ 0 & 0 & 1 & 0 & 1 & 1 & 1 & 0 & 1 \\ 5 & 48 & 124 & 19 & 250 & 116 & 94 & 37 \\ 91 & 55 & 18 & 210 & 165 & 47 & 47 & 15 \end{bmatrix} \begin{matrix} E_0 \\ E_1 \\ E_2 \\ E_3 \\ E_4 \\ E_5 \\ E_6 \\ E_7 \\ E_8 \\ E_9 \end{matrix}$$

FIG. 9B $$\begin{bmatrix} 1 & 0 & 0 & 1 & 0 & 0 & 0 & 0 & 0 & 0 \\ 0 & 1 & 0 & 0 & 1 & 0 & 0 & 0 & 0 & 0 \\ 1 & 0 & 1 & 0 & 1 & 0 & 0 & 0 & 0 & 0 \\ 0 & 0 & 0 & 1 & 0 & 1 & 0 & 0 & 0 & 0 \\ 0 & 0 & 0 & 0 & 1 & 1 & 0 & 0 & 0 & 0 \\ 0 & 0 & 0 & 0 & 0 & 0 & 1 & 1 & 0 & 0 \\ 0 & 0 & 0 & 0 & 0 & 0 & 0 & 1 & 0 & 0 \\ 0 & 0 & 0 & 0 & 0 & 0 & 0 & 0 & 0 & 0 \\ 5 & 48 & 124 & 19 & 250 & 116 & 94 & 37 & & \\ 91 & 55 & 18 & 210 & 165 & 47 & 47 & 15 & & \end{bmatrix} \begin{matrix} D_1+D_4+D_5 \\ D_2+D_5 \\ D_3+D_5 \\ D_4+D_5+D_7 \\ D_6+D_7 \\ D_7 \\ 0 \\ 0 \\ E_8 \\ E_9 \end{matrix}$$

FIG. 10

| Successful Decoding Probability \ GF($2^n$) | $1-10^{-2}$ | $1-10^{-4}$ | $1-10^{-6}$ | $1-10^{-8}$ | $1-10^{-10}$ |
|---|---|---|---|---|---|
| GF(2) | 7 | 15 | 20 | 27 | - |
| GF($2^2$) | 4 | 7 | 11 | 14 | 17 |
| GF($2^4$) | 3 | 4 | 6 | 8 | 9 |
| GF($2^8$) | 2 | 3 | 4 | 5 | 6 |
| GF($2^{16}$) | 2 | 3 | 4 | 5 | 5 |
| GF($2^{32}$) | 2 | 3 | 4 | 5 | 5 |

FIG. 12

HYBRID CODEC APPARATUS AND METHOD FOR DATA TRANSFERRING

TECHNICAL FIELD

The disclosure generally relates to a hybrid codec apparatus and method for data transferring.

BACKGROUND

During data transferring, in order to let the receiving end to correctly determine the data transmitted by the transmitting end, a data encoding process is usually performed. After the transmitting end encodes the data to be transferred, the transmitting end will then transfer the encoded data through the physical channel. After the receiving end receives the encoded data, the receiving end performs the corresponding decoding process. On one hand, the decoding process is to extract the original source data, and on the other hand, the decoding process is to ensure the correctness of the original data.

Currently, numerous encoding and/or decoding techniques have been developed. For example, parity check bit is added to the end of source data so that the receiving end may determine whether the source data is correct. Or, an error correction code (ECC) part may be further added to the end of the source data so that the receiving end may correct some of the errors in addition to determining whether the data is received correctly.

To enable scalability and fault-tolerance of the encoded data distributed in computer network, Luby developed a new type of encoding, called LT code. FIG. 1 shows an exemplary schematic view of LT code. As shown in FIG. 1, LT code uses a special probability distribution to determine the degree used by each source symbol of a plurality of source symbols 110 during the encoding. The LT code considers a source file as a combination having a plurality of segments of equal size and takes a number (degree) of segments from the plurality of segments to perform XOR to generate encoded data. The LT encoded symbol 120 repeats the encoding operation until the decoder can recover the source file.

Another encoding type is called Raptor. The Raptor code is an extension of the LT code. The Raptor code has the characteristic of linear time encoding and decoding. FIG. 2 shows an exemplary schematic view of the Raptor code. As shown in FIG. 2, the encoding process of Raptor code includes two stages. The first stage is to use low complexity encoding technology to perform one-to-one encoding on a plurality of source file segments, i.e., a plurality of source symbols 210. The second stage is to perform the re-coding on the pre-coded symbol 220 by using the LT coding of FIG. 1. Finally, the Raptor coded symbol 230 is transmitted to the decoder.

In the application of peer to peer (P2P) system, the encoded data will be relayed between the peers. Each peer will re-code the received encoded data and then relayed to other peers. Therefore, with Raptor code, a plurality of multi-layered steps must be taken to decode.

Network coding is a technique for relaying files in a multi-path network. FIG. 3 shows an exemplary schematic view of the application of network coding technique in a distributed network. In FIG. 3, the receiving-end peers, such as, R1-R4, receive encoded packets from one or more peers, such as, C1-C8, delivered through multi-layered router to the designated destination peer, i.e., some of peers R1-R4, so that the destination peer may recover the source file. The encoded packet will be re-coded every time the packet passes through a single-layered router for transferring. For example, through two-layered of router routing, peer R1 receives the encoded packet from peers C1 and C5 and encoded packet from peers C2 and C6. In other words, the encoded packet will be re-coded every time the packet passes a single-layered router for transferring. This technique uses the random number within the same finite field during encoding and decoding.

In addition to protect the data transferring, the network coding technique may also utilize the bandwidth of the network efficiently. The data through the multi-path transmission may refer to each other and further decoding the source data via encoded data computation. Among the network encoding techniques, a technique is called random linear network coding (RLNC) technique. The RLNC technique uses a multi-bit finite field computation as a basis of encoding and decoding. The generated complex computation will reduce the data transmission throughput and the decoding rate.

Another technique is called binary network coding (BNC) technique, using XOR computation as the basis for encoding and decoding. In comparison with the RLNC technique, the BNC technique reduces the amount of computation and has a lower data transmission overhead as well as a more efficient encoding computation. When using the BNC technique, the transmission end must supply to transmit more data whenever there is a data loss during the transmission.

In the network coding techniques, the encoder divides the source file into N segments, and computes the linear combination N times for all the segments respectively to generate different main encoded data. The decoder may use matrix computation to recover the N main encoded data back to the source file. However, the individual encoded data may have mutual linear dependency, leading to invalid encoded data. Therefore, the decoder must transmit k additional encoded data so that the decoder can find N mutually linear independent encoded data from the received N+k data, and further recover back to the source file.

If the N main encoded data and k additional encoded data all use the finite field of smaller space, such as, Galois Field (GF(2)), the computation of encoding and decoding may be accomplished more efficiently. However, because a smaller space may easily lead to linear dependent encoded data, therefore, a larger k is required to ensure the existence of the N linear independent encoded data, and a higher transmission cost is required. On the other hand, if the N main encoded data and k additional data all use the finite field of a larger space, such as, $GF(2^8)$, the required transmission cost will be reduced because the encoded data is not easy to be dependent. However, the encoding and decoding computation will increase, too.

SUMMARY

The exemplary embodiments may provide a hybrid codec apparatus and method for data transferring.

A disclosed exemplary embodiment relates to a hybrid codec apparatus for data transferring. The apparatus comprises an encoder to divide a source file into N segments, generates N main encoded data in a first finite field and encodes the N segments in a second finite field to generate k additional encoded data. Then, the encoder outputs a set of encoding coefficients and the N+k encoded data, where N and k are non-negative integers. The apparatus also includes a decoder. The decoder combines the encoding coefficients and the N+k encoded data and decodes the N main encoded data in the first finite field. If the N segments cannot be decoded, the additional k encoded data are used to assist the decoding in the second finite field. Thereby, the decoder recovers the source file.

Another disclosed exemplary embodiment relates to a hybrid codec method for data transferring. The method comprises: dividing a source file into N segments, and encoding these N segments with two encoding schemes to generate N encoded data and k additional encoded data; transmitting a set of encoding coefficients and the N+k encoded data to a decoder; the decoder decoding the N encoded data with a corresponding decoding scheme; and when the decoder being unable to decode the N segments, the additional k encoded data being used to assist the decoding with another corresponding decoding scheme. Thereby, a recovered source file is produced via decoding by the decoder, wherein the two encoding schemes use two different finite fields of different space size for data encoding.

The foregoing and other features, aspects and advantages of the present invention will become better understood from a careful reading of a detailed description provided herein below with appropriate reference to the accompanying drawings.

BRIEF DESCRIPTION OF THE DRAWINGS

FIG. 5 shows an exemplary schematic view of dividing a source file into a plurality of segments, consistent with certain disclosed embodiments.

FIG. 6 shows an exemplary schematic view of a first working exemplar of encoding processing, consistent with certain disclosed embodiments.

FIG. 7A shows an exemplary schematic view of an augmented matrix in the decoding process of the first working exemplar, consistent with certain disclosed embodiments.

FIG. 7B shows an exemplary schematic view of the simplified augmented matrix of FIG. 7A, consistent with certain disclosed embodiments.

FIG. 8 shows an exemplary schematic view of a second working exemplar of encoding processing, consistent with certain disclosed embodiments.

FIG. 9A shows an exemplary schematic view of an augmented matrix in the decoding process of the second working exemplar, consistent with certain disclosed embodiments.

FIG. 9B shows an exemplary schematic view of the simplified augmented matrix of FIG. 9A, consistent with certain disclosed embodiments.

FIG. 10 shows an exemplary schematic view of using two additional encoded data to simplify the simplified matrix of FIG. 9B, consistent with certain disclosed embodiments.

FIG. 12 shows an exemplary table of the additional k value and related successful decoding probability under different n values, consistent with certain disclosed embodiments.

DETAILED DESCRIPTION OF THE EXEMPLARY EMBODIMENTS

The disclosed exemplary embodiments perform hybrid encoding and decoding between the transmitting end and the receiving end of the data transmission. In the data transferring mechanism, different finite fields of different space sizes are used to generate encoded data during encoding. If the source file is divided into N segments, the encoder uses the finite field with smaller space to generate N main encoded data and transmit to the decoder, with k additional encoded data attached. The k additional encoded data is encoded in the finite field of larger space. In this manner, the encoder may eliminate the linear dependent data from the N main encoded data through matrix computation more efficiently, and then combine the k additional encoded data to recover the source file.

Figure 1:
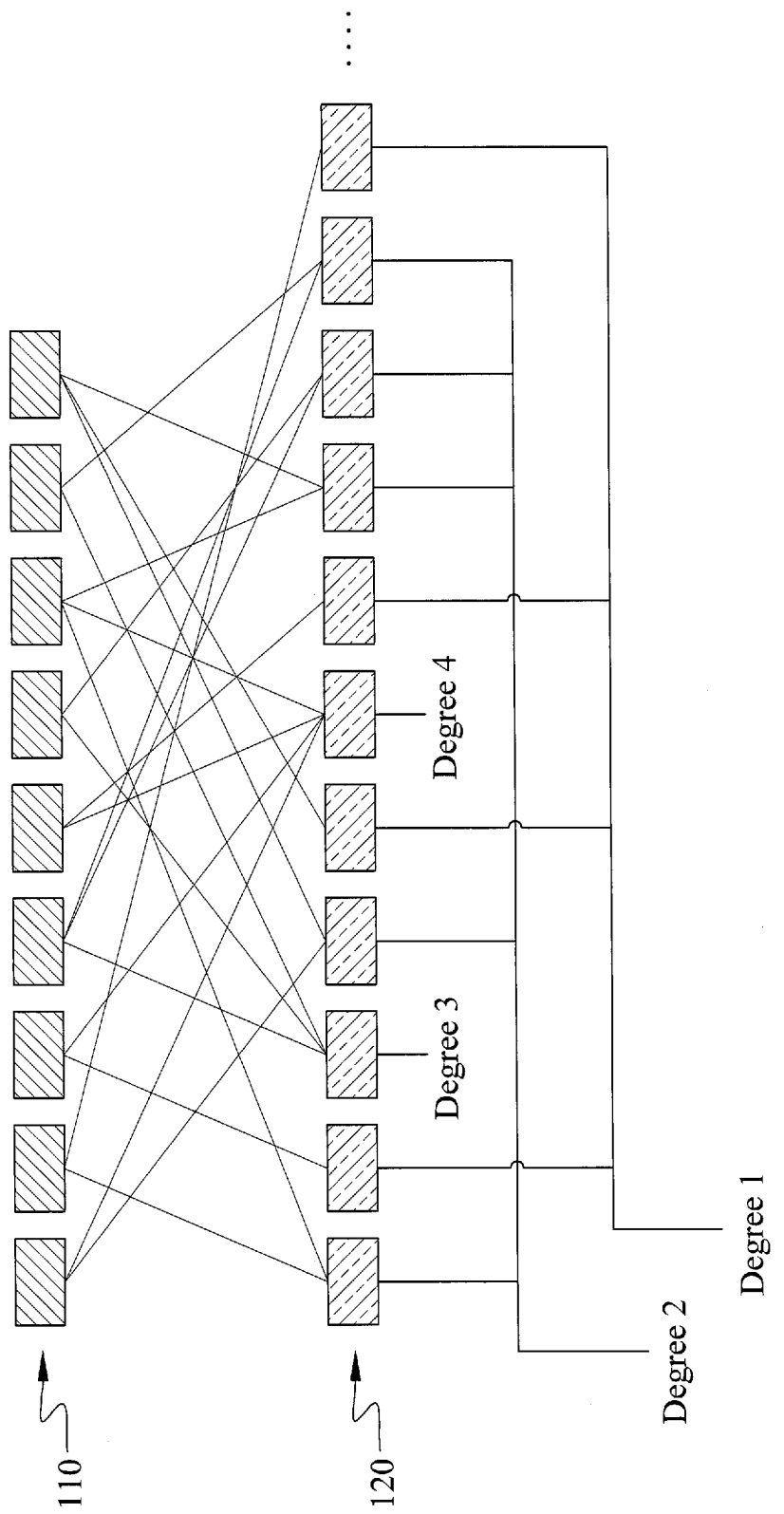
FIG. 1 shows an exemplary schematic view of the LT encoding.
Figure 2:
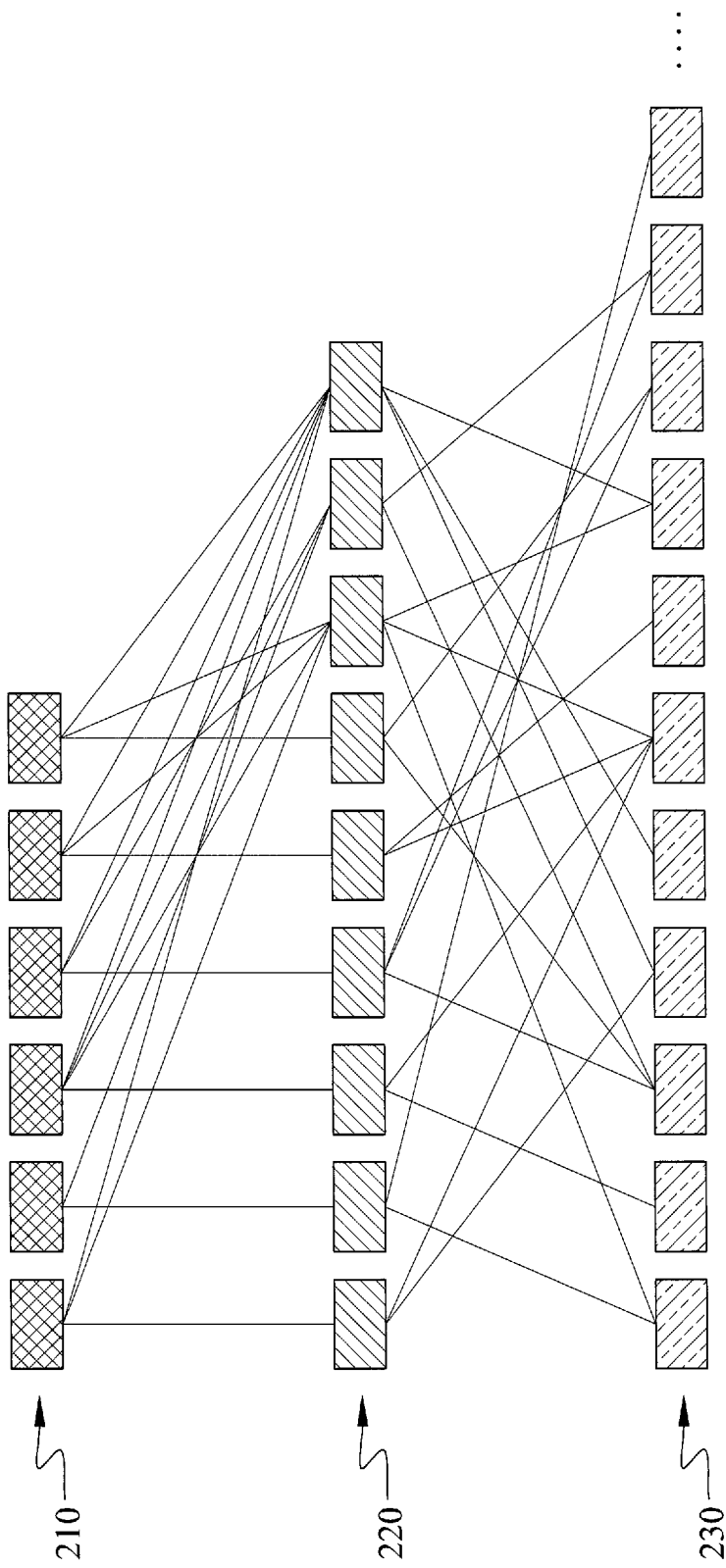
FIG. 2 shows an exemplary schematic view of Raptor encoding.
Figure 3:
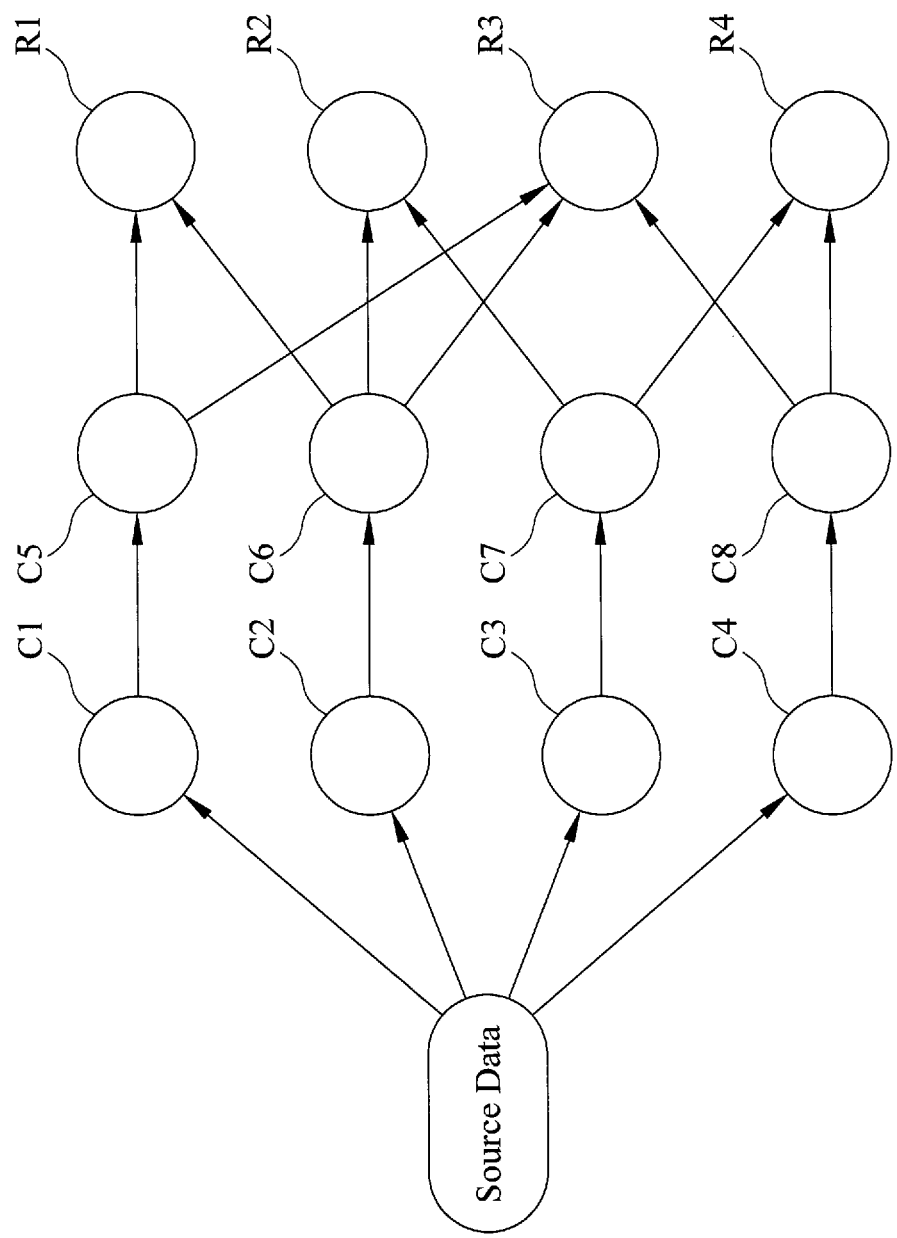
FIG. 3 shows a schematic view of an exemplary application of network coding to distributed network.
Figure 4:
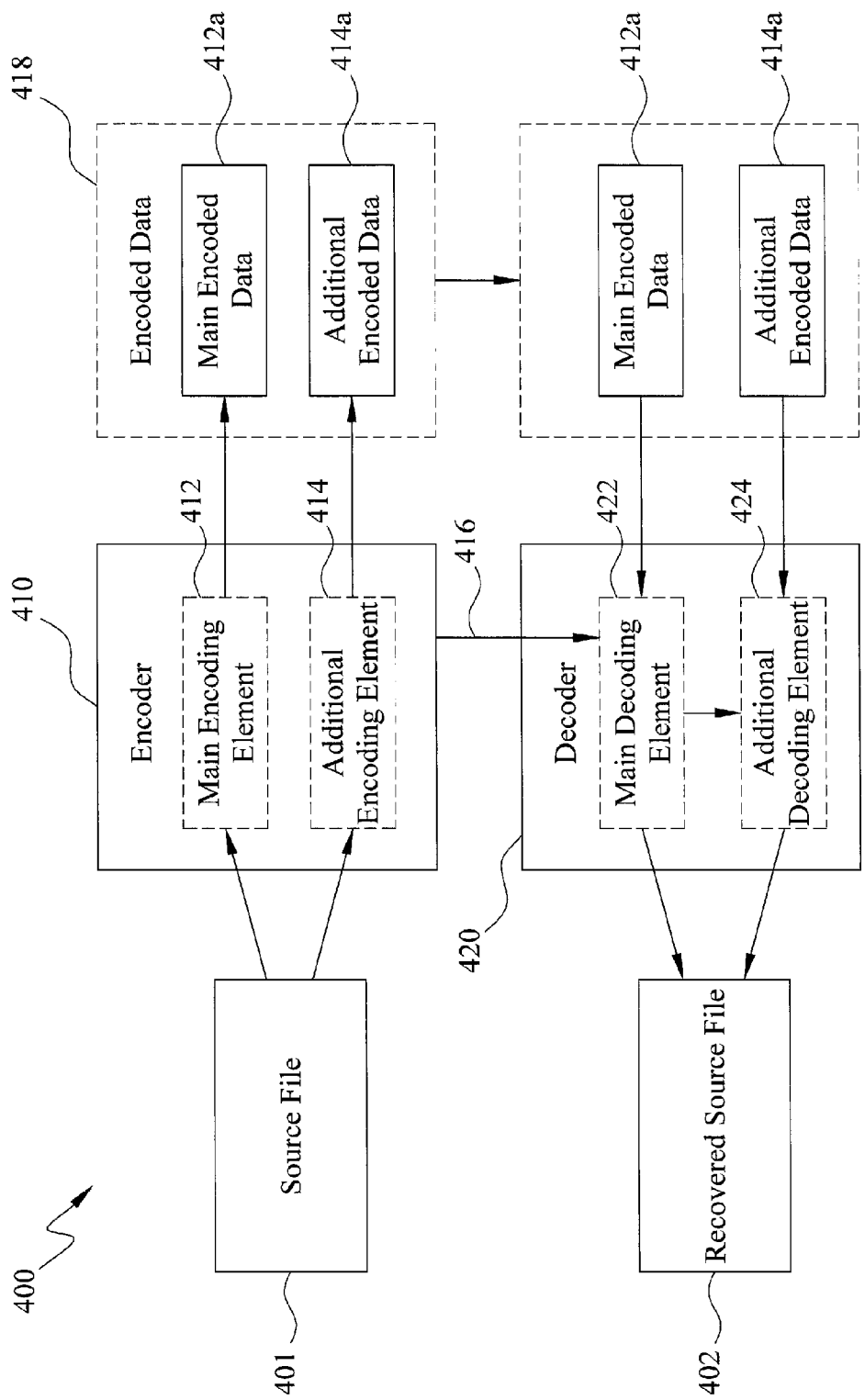
FIG. 4 shows an exemplary schematic view of a hybrid codec apparatus for data transferring, consistent with certain disclosed embodiments.

FIG. 4 shows an exemplary schematic view of the hybrid codec apparatus for data transferring, consistent with certain disclosed embodiments. Referring to FIG. 4, hybrid codec apparatus 400 comprises an encoder 410 and a decoder 420. Encoder 410 further includes a main encoding element 412 and an additional encoding element 414. Decoder 420 further includes a main decoding element 422 and an additional decoding element 424.

First, encoder 410 divides source file 401 into N segments, and encodes the N segments in a first finite filed by using main encoding element 412 to generate N main encoded data 412a. Then, additional encoding element 414 encodes the N segments in a second finite field to generate k additional encoded data 414a. Then, encoder 410 outputs a set of encoded coefficients 416 and N+k encoded data 418 to decoder 420, where both N and k are non-negative integers.

Decoder 420 combines the set of encoded coefficients 416 and N+k encoded data 418 first, such as, arranging the set of encoded coefficients into a matrix and merging with the N+k encoded data into an augmented matrix. Then, main decoding element 422 uses a matrix reduction method, such as, Gaussian Elimination, to simplify the augmented matrix to decode N main encoded data 412a in the first finite field. When main decoding element 422 cannot be decoded to obtain the N segments, additional decoding element 424 uses k additional encoded data 414a to assist in decoding the data in the second finite field. Thereby, a recovered source file 402 is produced via decoding by decoder 420.

Accordingly, in the exemplary embodiments, different finite fields of different sizes may be used to generate encoded data during the data transferring mechanism. The set of encoded coefficients 416 includes two parts of coefficients, wherein one part of the coefficients belongs to the first finite field, and the other part of coefficients belongs to the second finite field. In other words, the first finite field and the second finite field may be of different sizes. For example, the first finite field may use a smaller space, such as, GF(2), and the second finite field may be a larger space, such as $GF(2^8)$. In this manner, BNC and RLNC encoding methods may be used in hybrid for encoding process. The transmitting end may use BNC for encoding first, and then supplements with a plurality of RLNC encoded data. During decoding, the receiving end may use BNC to decode the main encoded data first, and then use RLNC for auxiliary decoding when the BNC decoding method is unable to decode the source file correctly.

The following uses two working exemplars to explain the hybrid BNC/RLNC encoding method, where the two working exemplars uses different encoding coefficient matrix, with N=8 as example. That is, source file 500 is divided into 8 segments, denoted as $D_0$-$D_7$, as shown in FIG. 5.

In the first working exemplar, the encoding process is described as follows. Source file 500 is divided into 8 segments, encoded in GF(2) space to generate N=8 main encoded data, denoted by $E_0$-$E_7$, and encoded in $GF(2^8)$ to generate k=2 additional encoded data, denoted by $E_8$-$E_9$ Encoded data $E_0$-$E_9$, along with the encoding coefficient matrix, are transmitted to the decoder. The encoding process is indicated as the matrix relation in FIG. 6. In FIG. 6, if the encoding coefficient matrix is divided into coefficient matrix A1 and coefficient matrix A2, $D_0$-$D_7$ are denoted by matrix D, $E_0$-$E_7$ are denoted by matrix E1, and $E_8$-$E_8$ are denoted by matrix E2, these matrix forms the following relation: E1=A1×D and E2=A2×D. In addition, the elements in coefficient matrix A1 belongs to GF(2) space, having value such as 0 or 1, and the elements in coefficient matrix A2 belongs to GF($2^8$) space, having value such as any integer of 0-255.

After the aforementioned coefficient matrix and encoded data $E_0$-$E_9$ are transmitted to the decoder, the decoding process is described as follows. The decoder combines the encoding coefficient matrix and the encoded data into an augmented matrix, as shown in FIG. 7A. Then, the BNC decoding method is used to decode in the GF(2) space by using Gaussian Elimination to simplify the 8×9 augmented matrix. The simplified matrix is as shown in FIG. 7B. In FIG. 7B, the simplified matrix has a rank of 8 in the GF(2) space, i.e., rank=N. In other words, in GF(2) space, the base row computation is used to simplify the augmented matrix made of linear equations to find 8 mutually linear independent encoded data to obtain one set of solution. Therefore, in the first working exemplar, it is not required to use the additional encoded for recovering the segments $D_0$-$D_7$ and reconstructing the original source file.

In the second working exemplar, the encoding process is similar to the first working exemplar, but with different elements of coefficient matrix A1, as can be seen from coefficient matrix 810 of FIG. 8. Similarly, after the aforementioned coefficient matrix and encoded data $E_0$-$E_9$ are transmitted to the decoder, the decoder combines the encoding coefficient matrix and the encoded data into an augmented matrix, as shown in FIG. 9A. Then, the BNC decoding method is used to decode in the GF(2) space by using Gaussian Elimination to simplify the 8×9 augmented matrix. The simplified matrix is as shown in FIG. 9B. In FIG. 9B, the simplified matrix includes two linear dependent encoded data 920. That is, there are no 8 mutually linear independent encoded data in the simplified matrix in GF(2) space. At this point, the two additional encoded data, i.e., $E_8$-$E_9$, in GF($2^8$) space are used to assist decoding the data.

Figure 10:
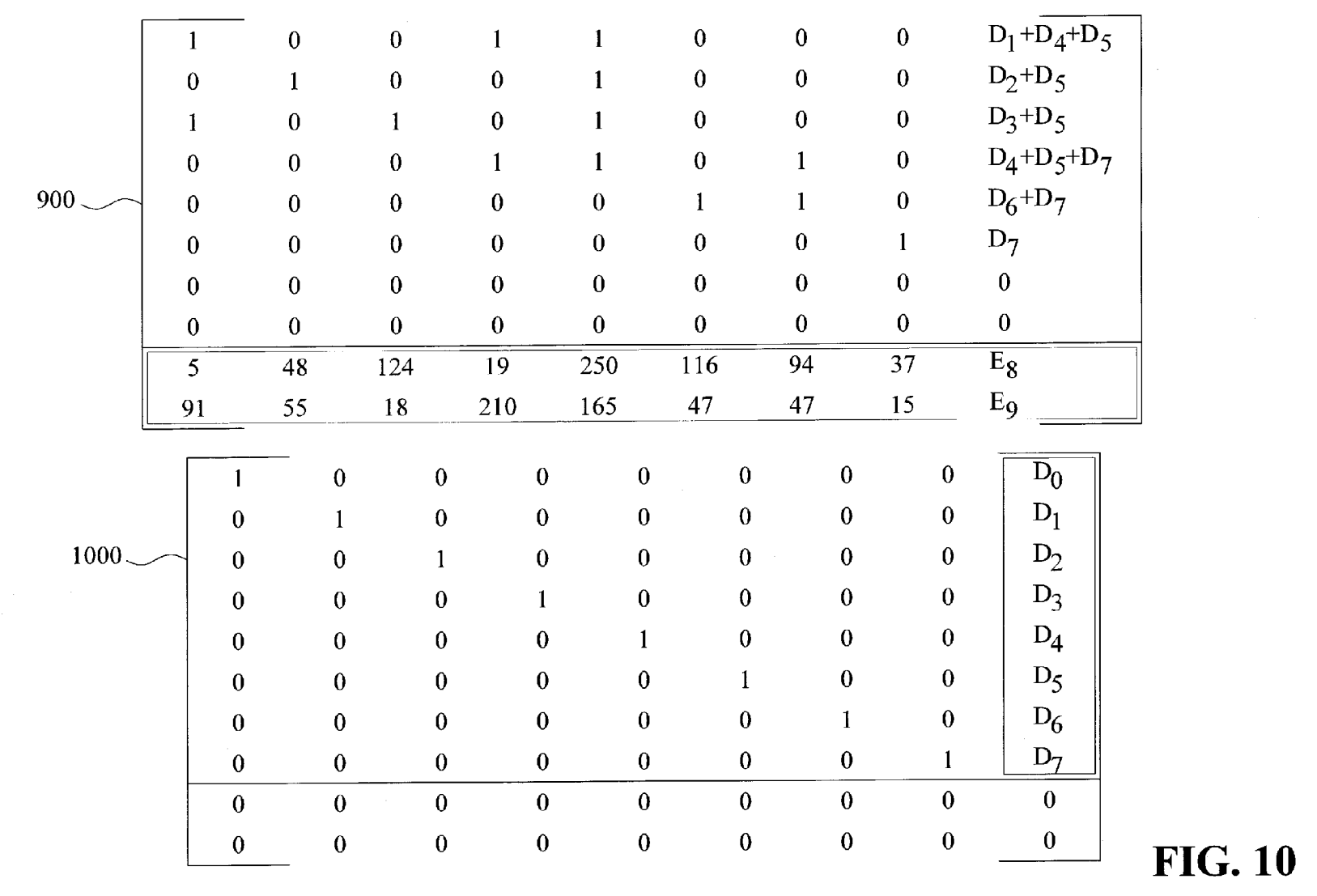

Therefore, for the simplified matrix in FIG. 9B, the two additional encoded data $E_8$-$E_9$ in GF($2^8$) space are used to assist in the RLNC method to decode in the GF($2^8$) space by Gaussian Elimination to simplify the 10×9 augmented matrix to matrix 1000 and find 8 mutually linear independent encoded data, as shown in FIG. 10. At this point, the rank of the simplified matrix is 8. Hence, in the second working exemplar, when decoding in GF(2) space is unable to obtain the 8 segments, the two additional encoded data in the GF($2^8$) space may be used to restore the segments $D_0$-$D_7$ and reconstruct to obtain source file.

In the second working exemplar, the encoder first uses a finite field of a smaller space to generate N main encoded data and transmits to the decoder, with attached additional encoded data of a finite field of a larger space. In this manner, the encoder may efficiently eliminate dependent items from the N main encoded data and then combines with the k additional encoded data to recover the source file.

Figure 11:
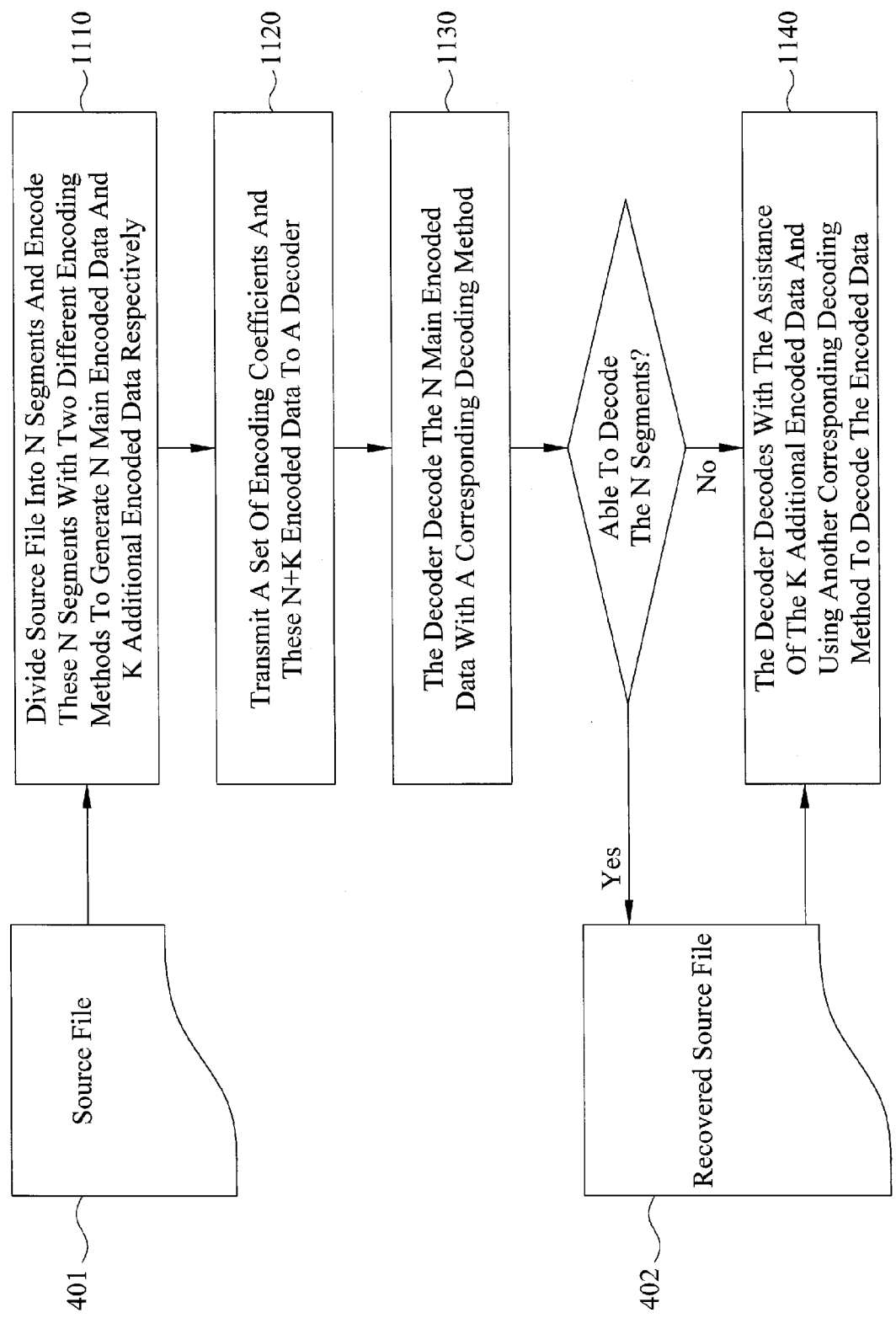
FIG. 11 shows an exemplary flowchart illustrating a hybrid codec method for data transferring, consistent with certain disclosed embodiments.

FIG. 11 shows an exemplary flowchart illustrating a hybrid codec method for data transferring, consistent with certain disclosed embodiments. In FIG. 11, source file 401 is divided into N segments and these N segments are encoded with two different encoding methods to generate N main encoded data and k additional encoded data respectively, as shown in step 1110. Then, a set of encoding coefficients and these N+k encoded data are transmitted to a decoder, as shown in step 1120. In step 1130, the decoder decodes the N main encoded data with a corresponding decoding method. When the decoder is unable to decode the N segments in step 1130, the decoder decodes the encoded data with the assistance of the k additional encoded data and using another corresponding decoding method, as shown in step 1140. Thereby, a recovered source file 402 may be produced via decoding by the decoder, where the two encoding methods uses finite fields of difference space sizes to encode the data.

In step 1110, the two encoding methods encode in a first finite field and a second finite filed. These two encoding methods may be, such as, BNC and RLNC, or linear network coding, and so on. In the data transferring mechanism, the hybrid of BNC in a smaller space finite field and RLNC in a larger space finite field may achieve the same result by using a small amount of computation and data transferring. In step 1120, the decoder may use the corresponding BNC decoding method to decode the N main encoded data in the finite field of a smaller space, by eliminating dependent items in the N main encoded data via matrix computation, such as, using Gaussian Elimination to simplify the augmented matrix. In step 1130, when the decoder is unable to decode the N segments, the k additional encoded of finite field of a larger space is used to assist the RLNC corresponding method to decode the data, as in step 1140.

The disclosed exemplary embodiments may also provide a table of the optimal k values for hybrid BNC/RLNC. Take finite field GF($2^n$) as an example. FIG. 12 shows an exemplary table of the additional k value and related successful decoding probability under different n values, consistent with certain disclosed embodiments. In the table of FIG. 12, GF($2^n$) is the finite field used to transmit the k additional encoded data in RLNC method.

For example, when the used finite filed is GF($2^4$), to achieve the successful decoding probability of $1-10^{-6}$ will need to increase 6 (k=6) additional encoded data. For the aforementioned second working exemplar, if the used finite field is GF($2^8$) and two additional encoded data are transmitted (k=2), the successful decoding probability will reach $1-10^{-2}$. As can be seen from FIG. 12, when 3, i.e., when the finite field space is larger than or equal to GF($2^8$) space, and the increased encoded data k=2, 3, 4, 5, the successful decoding probability reach $1-10^{-2}$, $1-10^{-4}$, $1-10^{-6}$, $1-10^{-8}$ respectively. To achieve successful decoding probability of $1-10^{-10}$, the conditions may be finite field GF($2^2$) with 17 additional encoded data, finite field GF($2^4$) with 9 additional encoded data, finite field GF($2^8$) with 6 additional encoded data, or finite field GF($2^{16}$) with 5 additional encoded data. Hence, by referring the table shown in FIG. 12, a smaller amount of computation and data transmission may also achieve the same result.

The k value in the table of FIG. 12 may also be supported by the following equations. Let f(m,n,r,t) be the event probability of an m×n random matrix in GF(t) with rank=r, where both m and n are greater than 1 and r≤min(n,m). Then, the following equation holds:

$$f(m, n, r, t) = \frac{1}{t^{m \times n}}, \text{ if } r = 0;$$

$$= \left(1 - \frac{1}{t^{n-r+1}}\right)\left(1 - \frac{1}{t^{n-r+2}}\right) \cdots \left(1 - \frac{1}{t^n}\right), \text{ if } m = r \geq 1;$$

-continued $$= \left(1 - \frac{1}{t^{n-r}}\right) f(m-1, n, r, t) +$$

$$\left(1 - \frac{1}{t^{n-r+1}}\right) f(m-1, n, r-1, t), \text{ if } m > r \geq 1$$

Another relation is described as follows. Let S be an n-r dimensional subspace in $GF(t)^n$, and A is an m×n random matrix, where m≥r. Let g(m,n,r,t) be the event probability of the row space of S and A able to expand. Then, the following equation holds:

$$g(m, n, r, t) = 1, \text{ if } r = 0;$$

$$= \left(1 - \frac{1}{t^1}\right)\left(1 - \frac{1}{t^2}\right) \cdots \left(1 - \frac{1}{t^r}\right), \text{ if } m = r \geq 1;$$

$$= \left(1 - \frac{1}{t^r}\right) g(m-1, n, r, t) + \left(1 - \frac{1}{t^r}\right) g(m-1, n, r-1, t),$$

if $m > r \geq 1 \circ$

In summary, the disclosed exemplary embodiments use a hybrid encoding method from two encoding schemes in data transferring mechanism. The employed hybrid encoding method uses different finite fields of different space sizes to encode data. For data transferring, a finite field of smaller space is used to encode the data and then a finite field of larger space is used to generate and supplement additional encoded data. During decoding, the finite field of smaller space is used to decode the data and then the finite field of larger space is used to assist decoding with additional encoded data when the decoding in the finite field of smaller space is unsuccessful. In this manner, a smaller amount of computation and data transferring may be used to achieve the same result.

Although the present disclosure has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A hybrid coding and decoding (codec) apparatus for data transmission, comprising:
    an encoder for dividing a source file into N segments, generating N main encoded data in a first finite field and encoding said N segments in a second finite field to generate k additional encoded data, then outputting a set of encoding coefficients and said N+k encoded data, where N and k being non-negative integers; and
    a decoder for combining said set of encoding coefficients and said N+k encoded data, decoding said N main encoded data in said first finite field, when said decoder being unable to decoded said N segments, said decoder using said additional k encoded data to assist decoding in said second finite field; thereby, a recovered source file being produced via decoding by said decoder.

2. The apparatus as claimed in claim 1, wherein said encoder further includes:
    a main encoding element for encoding said N segments in said first finite field to generate said N main encoded data; and
    an additional encoding element for encoding said N segments in said second finite field to generate said k additional encoded data.

3. The apparatus as claimed in claim 1, wherein said decoder further includes:
    a main decoding element for decoding said N main encoded data in said first finite field; and
    an additional decoding element for using said k additional encoded data to assist in decoding in said second finite field.

4. The apparatus as claimed in claim 1, wherein said first finite field and said second finite field are finite fields of different space sizes.

5. The apparatus as claimed in claim 1, wherein said first finite field has a smaller space size of said second finite field.

6. The apparatus as claimed in claim 1, wherein said first finite field uses binary network coding.

7. The apparatus as claimed in claim 1, wherein random linear network coding is used for coding in said second finite field.

8. The apparatus as claimed in claim 1, wherein said set of encoding coefficients includes two parts of coefficients, with one part of said coefficients belonging to said first finite field and the other part of said coefficients belonging to said second finite field.

9. The apparatus as claimed in claim 1, said apparatus further provides a table of optimal k values for using a hybrid encoding of binary network coding and random linear network coding.

10. A hybrid coding and decoding (codec) method for data transferring, performed in a coding and decoding (codec) apparatus, said method comprising:
    dividing a source file into N segments, and encoding said N segments with two encoding schemes to generate N main encoded data and k additional encoded data, both N and k being non-negative integers;
    transmitting a set of encoding coefficients and the N+k encoded data to a decoder;
    said decoder decoding said N main encoded data with a corresponding decoding scheme; and
    when said decoder being unable to decode said N segments, said k additional encoded data being used to assist in decoding with another corresponding decoding scheme, thereby, a recovered source file being produced via decoding by said decoder;
    wherein said two encoding schemes use two different finite fields of different space sizes for data encoding.

11. The method as claimed in claim 10, wherein said two encoding schemes are binary network coding and random linear network coding.

12. The method as claimed in claim 11, wherein said decoder uses a decoding scheme corresponding to said binary network coding to decode said N main encoded data.

13. The method as claimed in claim 12, wherein when said decoder is unable to decode said N segments, said decoder uses a decoding scheme corresponding to said random linear network coding to decode data.

14. The method as claimed in claim 11, wherein said binary network coding uses a finite field of a space smaller than that of a finite field used by said random linear network coding.

15. The method as claimed in claim 14, wherein said finite field used by random linear network coding is a Galois Field $GF(2^n)$, $n \geq 2$.

16. The method as claimed in claim 15, said method further provides a table of optimal k values for using a hybrid encoding of the binary network coding and the random linear network coding.

17. The method as claimed in claim 16, wherein when $n \geq 8$, and when k=2, 3, 4, 5, successful decoding probability reaches $1-10^{-2}$, $1-10^{-4}$, $1-10^{-6}$, and $1-10^{-8}$, respectively.

\* \* \* \* \*